(12) United States Patent
Chae et al.

(10) Patent No.: US 8,853,686 B2
(45) Date of Patent: Oct. 7, 2014

(54) FLAT PANEL DISPLAY DEVICE WITH OXIDE THIN FILM TRANSISTOR AND METHOD FOR FABRICATING THE SAME

(75) Inventors: Ji Eun Chae, Gumi-si (KR); Jung Eun Ahn, Jung-ri (KR); Tae Keun Lee, Jung-ri (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/587,611

(22) Filed: Aug. 16, 2012

(65) Prior Publication Data
US 2013/0056726 A1 Mar. 7, 2013

(30) Foreign Application Priority Data

Sep. 2, 2011 (KR) ........................ 10-2011-0089280

(51) Int. Cl.
 *H01L 21/44* (2006.01)
 *H01L 27/12* (2006.01)
 *H01L 27/32* (2006.01)

(52) U.S. Cl.
 CPC ........ *H01L 27/1225* (2013.01); *H01L 27/3276* (2013.01); *H01L 27/1288* (2013.01); *H01L 2227/323* (2013.01)

USPC ................... 257/43; 438/23; 438/29; 438/34; 438/104; 438/158

(58) Field of Classification Search
 USPC ............. 257/43, E21.476, E29.296, E21.411, 257/E29.273, E21.414
 See application file for complete search history.

(56) References Cited

U.S. PATENT DOCUMENTS

| | | | |
|---|---|---|---|
| 2005/0270451 A1* | 12/2005 | Ahn | 349/114 |
| 2009/0201455 A1* | 8/2009 | Murai | 349/139 |
| 2011/0143504 A1* | 6/2011 | Yang | 438/156 |

* cited by examiner

*Primary Examiner* — Chuong A Luu
*Assistant Examiner* — Rodolfo Fortich
(74) *Attorney, Agent, or Firm* — Brinks Gilson & Lione

(57) ABSTRACT

A flat panel display device with an oxide thin film transistor and a fabricating method thereof are disclosed. The fabricating method of the flat panel display device includes: preparing a substrate defined into a pixel region and a pad contact region; forming a gate electrode and a link line; forming a pixel electrode within the pixel region; forming an oxide layer on the substrate provided with the pixel electrode; forming a passivation layer on the substrate and performing a formation process of contact holes to expose the link line; and forming a second transparent conductive material film on the substrate.

14 Claims, 9 Drawing Sheets

<PAD CONTACT REGION>  <PINHOLE FAULT>

<TFT REGION>  <PAD CONTACT REGION>

FLAT PANEL DISPLAY DEVICE WITH OXIDE THIN FILM TRANSISTOR AND METHOD FOR FABRICATING THE SAME

This application claims the priority and the benefit under 35 U.S.C. §119(a) on Korean Patent Application No. 10-2011-0089280, filed on Sep. 2, 2011, the entire contents of which are hereby incorporated by reference.

BACKGROUND

1. Field of the Invention

This disclosure relates to a flat panel display device with an oxide thin film transistor and a method of fabricating the same.

2. Discussion of the Related Art

Image display devices used for displaying a variety of information on a screen are one of the core technologies of the information and communication era. Such image display devices have been being developed to be thinner, lighter, and more portable, and furthermore to have a high performance. Actually, flat panel display devices are spotlighted in the display field due to their reduced weight and volume, well known disadvantages of cathode ray tubes (CRTs). Flat panel display devices include OLED (organic light-emitting display) devices, which display images by controlling the light emitting quantity of an organic light emission layer.

The OLED devices are self-illuminating display devices employing a thin light emission layer between electrodes. As such, the OLED devices can become thinner like a paper. Such OLED devices display images by emitting light through an encapsulated substrate. The encapsulated substrate includes a plurality of pixels arranged in a matrix shape and each configured with 3 colored (i.e., red, green and blue) sub-pixels, a cell driver array, and an organic light emission array.

In order to realize a variety of colors, the OLED device employs organic light emission layers, which are configured to emit red, green and blue lights, respectively. The organic light emission layer is interposed between two electrodes and used to form an organic light emission diode.

The OLED device requires a thin film transistor, which can be driven faster. To this end, the OLED device uses an oxide film, such as an IGZO (indium gallium zinc oxide) film, instead of amorphous silicon film a-Si.

FIG. 1 is a cross-sectional view schematically showing a flat panel display device according to the related art.

As shown in FIG. 1, the flat panel display device includes a pixel region 15 configured with a plurality of defined pixel portions and used to display an image, and a data driver 12 disposed in a peripheral area of the pixel region 15. A gate driver is included in the data driver 12 or formed in another peripheral area of the pixel region 15.

The pixel portions within the pixel region 15 are defined gate lines and data lines crossing each other. Also, each of the pixel portions includes thin film transistors formed in such a manner as to be connected to the gate line and the data line.

A plurality of pads is formed on a driver region in which the data driver 12 is disposed. The plurality of pads is used to apply signals to the gate lines and the data lines. The pads are connected to a plurality of line lines. As such, the plurality of link lines are connected to the gate and data lines extended from the pixel region 15.

Particularly, the plurality of link lines are simultaneously formed on a substrate when the gate lines corresponding to low resistance wirings are formed. The data line and the gate line are connected to each other in a pad contact region by means of a connection electrode, because the data line is positioned over the gate line with having an insulation layer therebetween.

FIG. 2 is a data sheet including photographs which illustrate a pin hole fault generated in a pad contact region of the flat panel display device according to the related art. FIG. 3 is a cross-sectional view showing a TFT region within a pixel region and pad contact region taken along a line X-X' in FIG. 2.

Referring to FIGS. 2 and 3, the thin film transistor formed in a pixel region is configured with a gate electrode 101, an active layer and source/drain electrodes 107a and 107b. The gate electrode 101 is formed on a substrate 100. The active layer includes a channel layer 104 and an ohmic contact layer 105 which are formed over the gate electrode 101 with having a gate insulation film 102 therebetween.

Also, the drain electrode 107b of the thin film transistor formed within the pixel region is connected to a pixel electrode 110 through a contact hole, which is formed in a passivation layer 109.

Meanwhile, a data line 160 within the pad contact region is connected the link line 150, which is formed in an outside of the pixel region 15, by a connection electrode 170. If a fourth mask procedure uses one of a diffraction mask and a half tone mask, an ohmic contact layer pattern 105a and a channel layer pattern 104a remain under the data line 160.

However, as seen from FIGS. 2 and 3, the gate insulation film 102 and the passivation layer are stacked on the link line 150 formed on the substrate 100, and the passivation layer is only formed on the data line 160. As such, etching depths for forming contact holes are different from each other.

Due to this, a pin hole fault can be generated in the data line 160, which covered with only the passivation layer 109, by an over-etch. More specifically, both the gate insulation film 102 and the passivation layer 109 must be etched in order to form a contact hole in the link line 150, which is formed on the substrate 100. On the other hand, when another contact hole is formed in the data line 160 covered with only the passivation layer 109, a pin hole fault by which the gate insulation film 102 under the data line 160 is also etched can be generated in such a manner that another contact hole passes through the data line 160.

Such a pin hole fault damages the data line 160 and the gate insulation film 102. Due to this, a variety of faults including the disconnection of a metal film formed in a contact hole region can be generated.

BRIEF SUMMARY

A method of fabricating a flat panel display device with an oxide thin film transistor in accordance with one general aspect of the present embodiment includes: preparing a substrate defined into a pixel region and a pad contact region; forming a gate electrode and a link line in the pixel region and the pad contact region of the substrate; sequentially forming a gate insulation film and a first transparent conductive material film on the substrate provided with the gate electrode and performing a first mask procedure for the first transparent conductive material film to form a pixel electrode within the pixel region; forming an oxide layer on the substrate provided with the pixel electrode and performing a second mask procedure for the oxide layer to form a channel layer on the gate insulation film opposite to the gate electrode; forming an insulation layer on the substrate provided with the channel layer and performing a third mask procedure for the insulation layer to form an etch stopper, which is disposed on the channel layer, and an auxiliary etch stopper disposed on the pad contact region which will be occupied by a data line; forming a metal film on the entire surface of the substrate after the etch stopper is formed on the substrate and performing a fourth mask procedure for the metal film to form source and drain electrodes and the data line, which has one end overlapping with the auxiliary etch stopper within the pad contact region; forming a passivation layer on the substrate provided with the source and drain electrodes and performing a formation process of contact holes to expose the link line and the data line opposite to the auxiliary etch stopper; and forming a second transparent conductive material film on the substrate with the contact holes and performing a fifth mask procedure to form a common electrode, which is disposed within the pixel region, and a connection electrode which is disposed within the pad contact region and connects the data line with the link line.

A method of fabricating a flat panel display device with an oxide thin film transistor in accordance with one general aspect of the present embodiment includes: preparing a substrate defined into a pixel region and a pad contact region; forming a gate electrode and a link line in the pixel region and the pad contact region of the substrate; sequentially forming a gate insulation film and an oxide layer on the substrate provided with the gate electrode and performing a first mask procedure for the oxide layer to form a channel layer on the gate insulation film opposite to the gate electrode; forming an insulation layer on the substrate provided with the channel layer and performing a second mask procedure for the insulation layer to form an etch stopper, which is disposed on the channel layer, and an auxiliary etch stopper disposed on the pad contact region which will be occupied by a data line; forming a metal film on the entire surface of the substrate after the etch stopper is formed on the substrate and performing a third mask procedure for the metal film to form source and drain electrodes and the data line, which has one end overlapping with the auxiliary etch stopper within the pad contact region; sequentially forming a first passivation layer and a first transparent conductive material film on the substrate provided with the source and drain electrodes and performing a fourth mask procedure for the first transparent conductive material film to form a common electrode on the first passivation layer within the pixel region; forming a second passivation layer on the substrate provided with the common electrode and performing a formation process of contact holes to form contact holes over the drain electrode, the link line and the data line opposite to the auxiliary etch stopper; and forming a second transparent conductive material film on the substrate with the contact holes and performing a fifth mask procedure to form a pixel electrode, which is disposed on the second passivation layer opposite to the common electrode within the pixel region, and a connection electrode which is disposed within the pad contact region and connects the data line with the link line.

A flat panel display device with an oxide thin film transistor in accordance with one general aspect of the present embodiment includes: a substrate defined into a pixel region and a pad contact region; a thin film transistor disposed on the pixel region and configured to include a gate electrode, a gate insulation film, a channel formed from an oxide, and source and drain electrodes; a pixel electrode disposed within the pixel region of the substrate and electrically connected to the drain electrode of the thin film transistor; a common electrode disposed on a passivation layer opposite to the pixel electrode; a link line disposed within the pad contact region of the substrate; a data line extended to the pad contact region adjacent to the link line and disposed on the gate insulation film; a connection electrode configured to electrically connect the link line with the data line; and an auxiliary etch stopper disposed under the data line which comes in contact with the connection electrode.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION OF THE DRAWINGS AND THE PRESENTLY PREFERRED EMBODIMENTS

Figure 1:
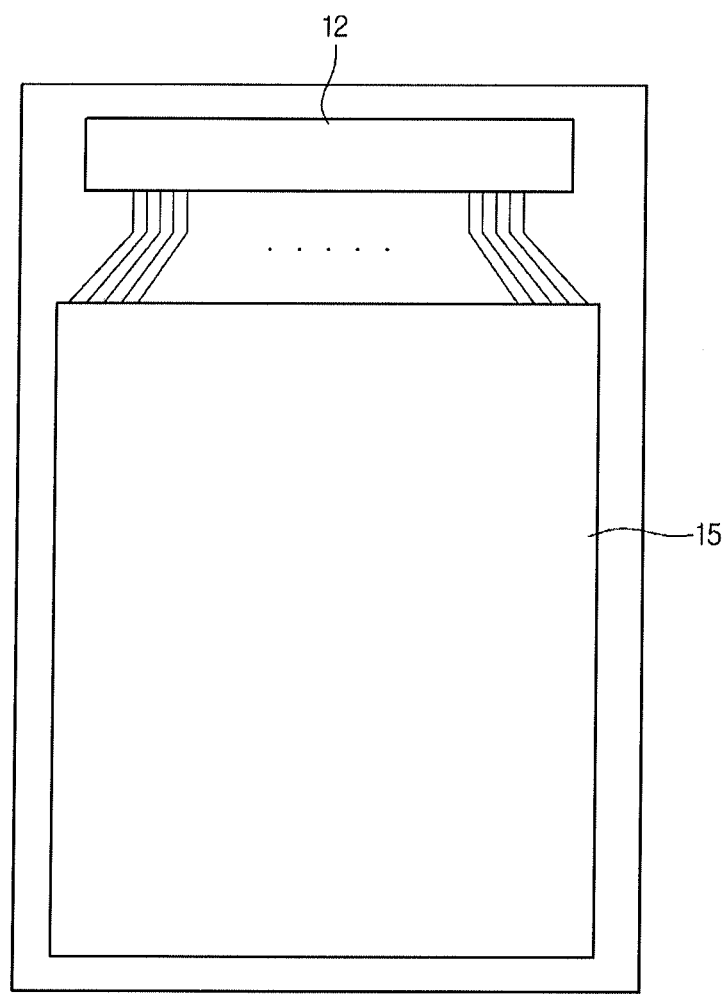
FIG. 1 is a cross-sectional view schematically showing a flat panel display device according to the related art.
Figure 2:
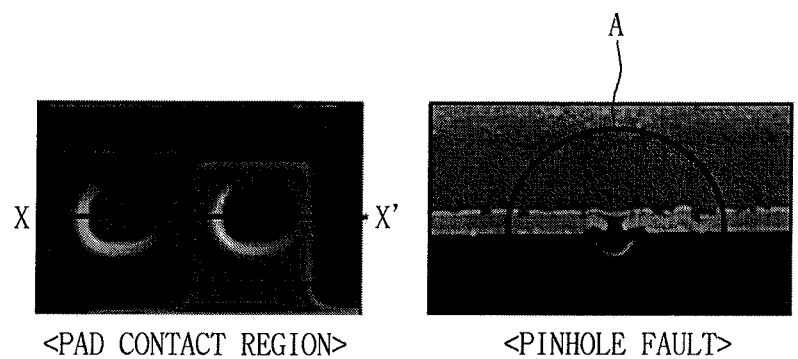
FIG. 2 is a data sheet including photographs which illustrate a pin hole fault generated in a pad contact region of the flat panel display device according to the related art.
Figure 3:
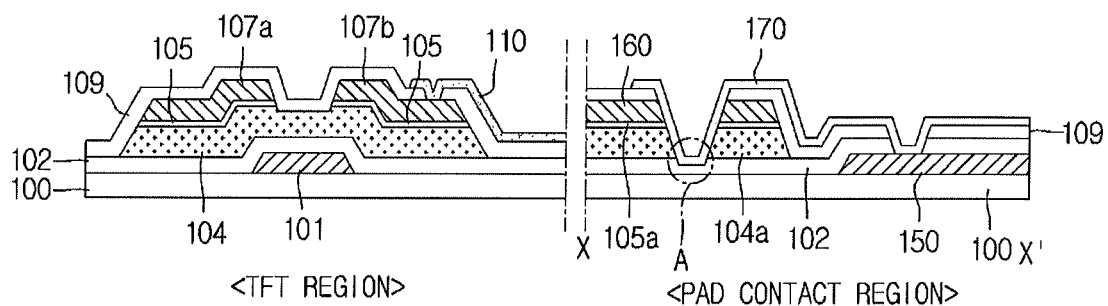
FIG. 3 is a cross-sectional view showing a TFT region within a pixel region and a pad contact region taken along a line X-X' in FIG. 2.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

Figure 4:
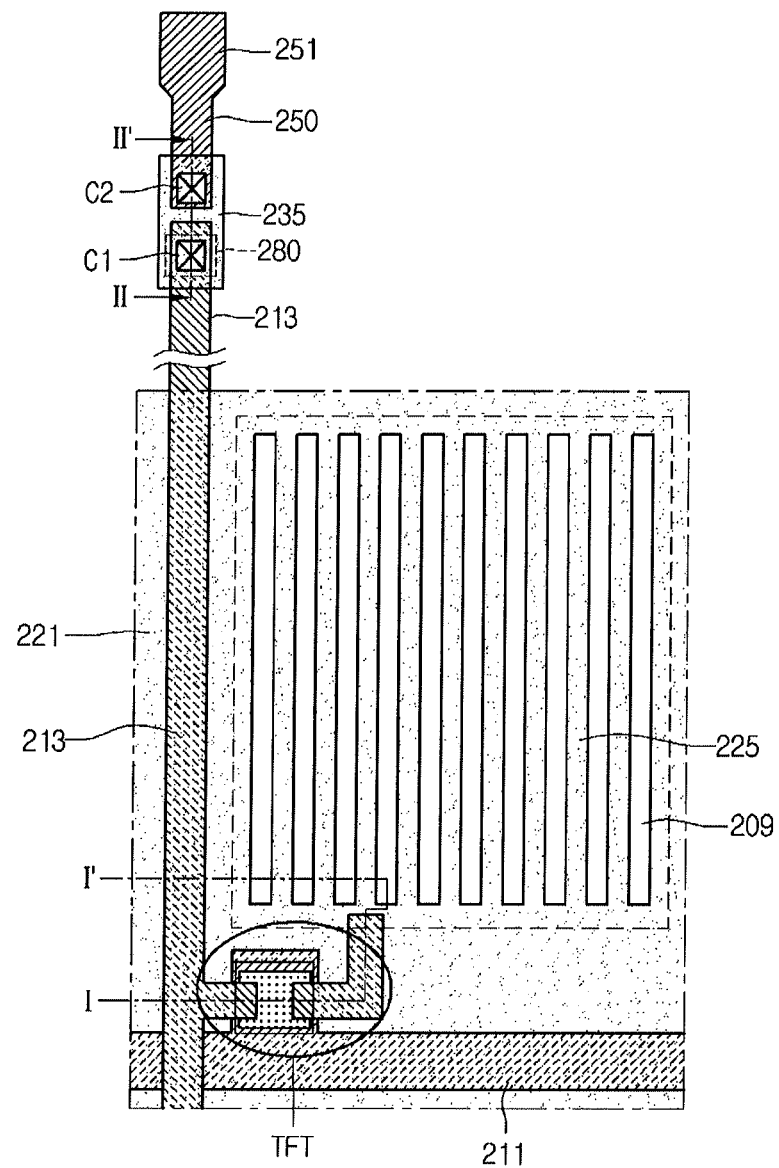
FIG. 4 is a planar view showing a pixel region and a pad contact region of a flat panel display device according to a first embodiment of the present disclosure.

FIG. 4 is a planar view showing a pixel region and a pad contact region of a flat panel display device according to a first embodiment of the present disclosure.

As shown in FIG. 4, the flat panel display device according to a first embodiment of the present disclosure gate and data lines 211 and 213 arranged to cross each other. A pixel region is defined by the gate and data lines 211 and 213 crossing each other. A pixel electrode 209 and a common electrode 225 overlapping each other are arranged within the pixel region.

Also, a thin film transistor TFT is disposed at an intersection of the gate and data lines 211 and 213.

The data line 213 extends to the pad region. One end of the data line 213 is connected to a link line 250, which is formed in a single body united with a pad 251, by means of a connection electrode 235 passing through first and second contact holes C1 and C2.

In this embodiment, an auxiliary etch stopper 280 is formed under the data line 213 opposite to the first contact hole C1. The auxiliary etch stopper 280 prevents the generation of a pin hole fault in a first contact hole region within one end of the data line 213 due to an etch depth difference at the formation of the first and second contact holes C1 and C2.

The common electrode 225 is formed from a transparent conductive material and on a passivation layer within the pixel region. Although it is not clearly shown in the drawing, this embodiment forces a common wiring to be formed over the gate and data lines 211 and 213 in a single body united with the common electrode 225.

FIGS. 5A through 5E are cross-sectional views illustrating a method of fabricating a flat panel display device and being taken along lines I-I' and II-II' in FIG. 4.

Referring to FIGS. 5A through 5G, a gate electrode 201 is formed in a pixel region on a substrate 200 by forming a gate metal film on the entire surface of a substrate 200, which is defined the pixel region and a pad contact region, and performing a first mask procedure for the gate metal film. At the same time, a link line 250 connected to a data driver, a pad united with the link line 250 in a single body, and a gate line can be formed in the pad contact region.

The gate metal film can be formed from an opaque conductive material with a low resistance. As an example of the opaque conductive material with the low resistance, one material selected from a group which includes aluminum Al, an aluminum alloy, tungsten W, copper Cu, nickel Ni, chromium Cr, molybdenum Mo, titanium Ti, platinum Pt, tantalum Ta and so on, can be employed. Alternatively, the gate metal film can be formed in a multi layer structure in which at least one transparent conductive material film and at least one opaque conductive material film are stacked. In this case, as an example of the transparent conductive material, indium-tin-oxide ITO, indium-zinc-oxide IZO or others can be employed.

When the above-mentioned gate electrode 201 is formed on the entire surface of the substrate 200, a gate insulation film 202 is formed. The gate insulation film 202 can be formed in a single layer of silicon oxide $SiO_x$. Alternatively, the gate Insulation film 202 can be formed by continuously depositing silicon nitride $SiN_x$ and silicon oxide $SiO_x$.

Thereafter, a pixel electrode 209 is formed in the pixel region. The pixel electrode 209 can be prepared by forming a transparent conductive material layer on the entire surface of the above-mentioned substrate 200 and performing a second mask procedure for the transparent conductive material layer. The transparent conductive material layer can be formed from one of indium-tin-oxide ITO, indium-zinc-tin-oxide IZTO or others.

Figure 5A:
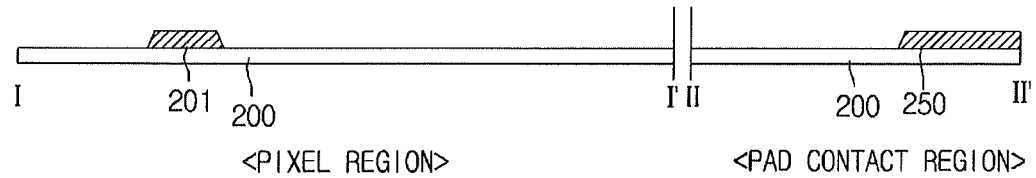
FIGS. 5A through 5G are cross-sectional views illustrating a method of fabricating a flat panel display device and being taken along lines I-I' and in FIG. 4.
Figure 5B:
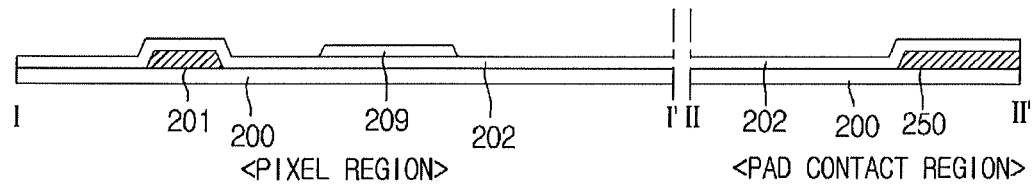
Figure 5C:
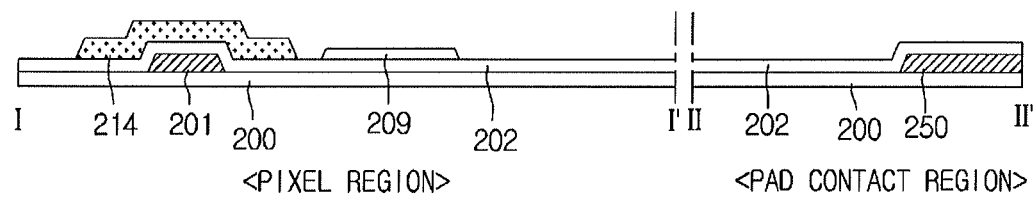

After the pixel electrode 209 is formed on the substrate 200 as described above, a channel layer 214 is formed on the gate insulation film 202 opposite to the gate electrode 201, as shown in FIG. 5C. The channel layer 214 can be provided by forming an oxide layer on the substrate 200 and performing a third mask procedure for the oxide layer.

The oxide layer can be formed from an amorphous oxide which includes at least one of indium In, zinc Zn, gallium Ga, hafnium Hf and so on. For example, when an oxide semiconductor of Ga—In—Zn—O is formed through a sputtering process, targets each formed from $In_2O_3$, $Ga_2O_3$ and ZnO or a single target formed from Ga—In—Zn oxide can be used. Alternatively, when an oxide semiconductor of Hf—In—Zn—O is formed through a sputtering process, targets each formed from $HfO_2$, $In_2O_3$ and ZnO or a single target formed from Hf—In—Zn oxide can be used.

Figure 5D:
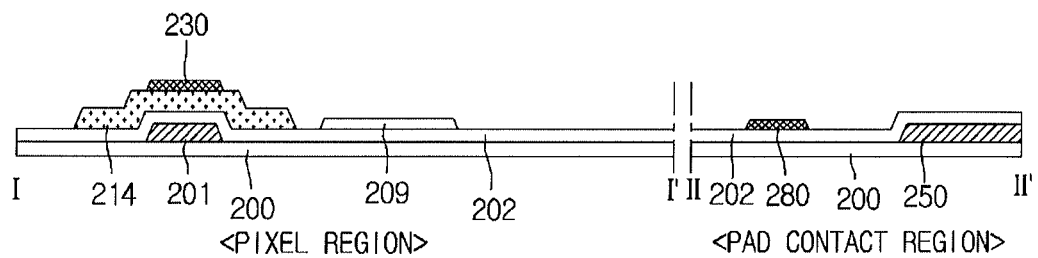
Figure 5E:
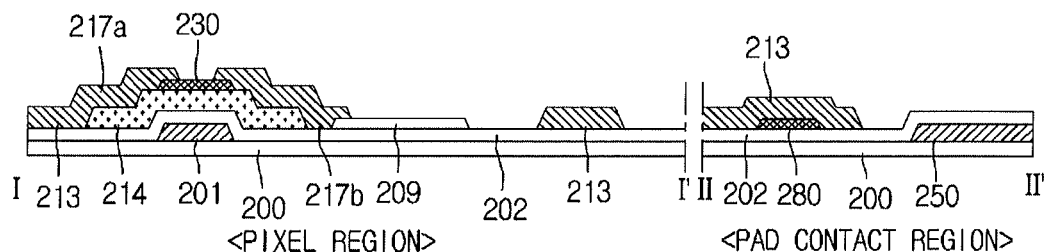

When the channel layer 214 is formed on the substrate 100, an etch stopper 230 is formed on the channel layer 214, as shown in FIGS. 5D and 5E. The etch stopper 230 can be provided by forming an insulation layer on the entire surface of the substrate 200 with the channel layer 214 and performing a fourth mask procedure for the insulation layer. At the same time, an auxiliary etch stopper 280 is also formed under one end of a data line which will be formed within the pad contact region later, i.e., an end region of the data line adjacent to the link line 250. As shown in FIG. 4, the auxiliary etch stopper 280 is formed on the gate insulation film 202 opposite to a first contact hole region within one end of the data line 213.

When the etch stopper 230 is formed on the substrate 200, a source electrode 217a and a drain electrode 217b are formed at both ends of the channel layer 214, as shown in FIG. 5E. In accordance therewith, a thin film transistor can be completed. The source and drain electrodes 217a and 217b can be provided by forming a source/drain metal film on the entire surface of the substrate 200 provided with the etch stopper 230 and performing a fifth mask procedure for the source/drain metal film. In this time, the data line 213 crossing the gate line 211 is formed within the pixel region. More specifically, the data line 260 electrically connected to the source electrode 217a is formed in such a manner as to extend to the pad contact region.

The source/drain metal film can be formed from an opaque conductive material with a low resistance. As an example of the opaque conductive material with the low resistance, one material selected from a group which includes aluminum Al, an aluminum alloy, tungsten W, copper Cu, nickel Ni, chromium Cr, molybdenum Mo, titanium Ti, platinum Pt, tantalum Ta and so on, can be employed. Alternatively, the source/drain metal film can be formed in a multi layer structure in which at least one transparent conductive material film and at least one opaque conductive material film are stacked. In this case, as an example of the transparent conductive material, indium-tin-oxide ITO, indium-zinc-oxide IZO or others can be employed.

Figure 5F:
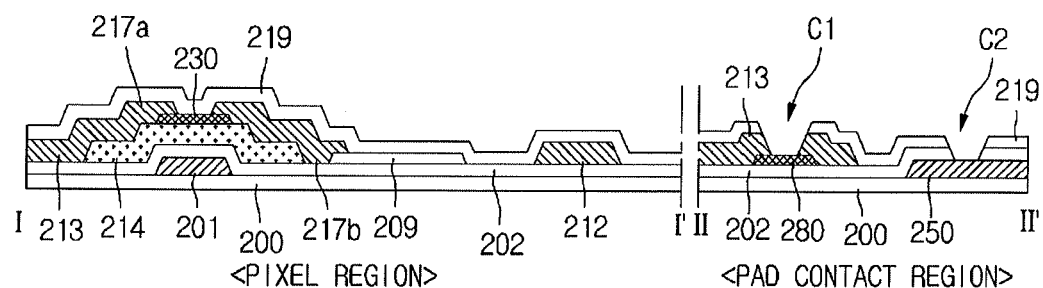

After the source and drain electrodes 217a and 217b are formed on the substrate 200, a passivation layer 219 is formed on the entire surface of the-above mentioned substrate 200, as shown in FIG. 5F. Subsequently, a contact hole formation process using a masking procedure can be performed for the passivation layer 219.

The first embodiment of the present disclosure forces the pixel electrode to be formed under a common electrode and in contact with the drain electrode 217b. As such, it is unnecessary to form a contact hole which is used to expose the drain electrode 217b.

Through the contact hole formation process, a first contact hole C1 is formed over the data line 213 opposite to the auxiliary etch stopper 280 within the pad contact region, and a second contact hole C2 is also formed on the link line 250 within the pad contact region. The first and second contact holes C1 and C2 are used to connect the data line 213 with the link line 250.

The etch depths of the first and second contact holes C1 and C2 are different from each other. This results from the fact that the gate insulation film 202 and the passivation layer 219 are stacked on the link line 250 but the passivation layer 219 is only formed on the data line 213.

As such, the data line 213 must be physically etched during the formation of the second contact hole C2. However, the auxiliary etch stopper formed under the data line 213 prevents an over etch which allows the gate insulation film 202 to be etched.

Consequently, the first embodiment of the present disclosure can prevent the generation of a pin hole fault in the pad contact region without employing an additional mask procedure.

Figure 5G:
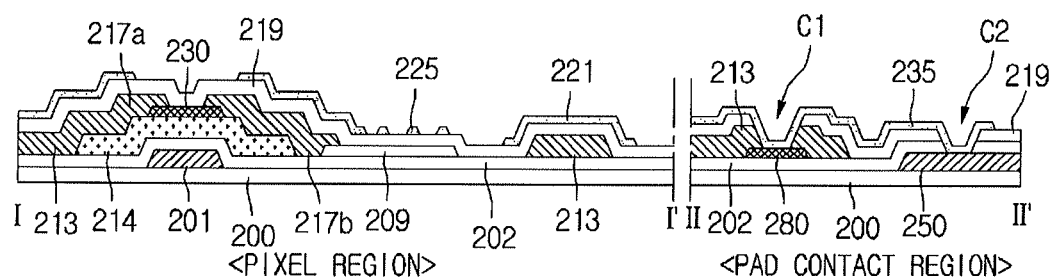

When the above-mentioned first and second contact holes C1 and C2 are formed, slit-shaped common electrodes 225 arranged over the pixel electrode 209 within the pixel region and a common line covering the gate and data lines 211 and 213 are formed, as shown in FIG. 5G. The common line 221 is formed in a single body united with the common electrodes 225. The common electrodes 225 and the common line 221 can be provided by forming a transparent conductive material film on the entire surface of the above-mentioned substrate 200 and performing a sixth mask procedure.

Moreover, a connection electrode 235 used to electrically connect the data line with the link line 250 is formed within the pad contact region. In other words, the data line 260 and the link line 250 are electrically connected to each other by the connection electrode 235 with both ends, which pass through the first and second contact holes C1 and C2, respectively.

The first embodiment of the present disclosure allows the auxiliary etch stopper to be formed under the data line within the pad contact region when the etch stopper is formed within the thin film transistor region. In accordance therewith, the generation of a pin hole fault in the data line region at the contact hole formation can be prevented.

Also, the first embodiment of the present disclosure can prevent the generation of a pin hole fault in the contact hole formation region of the passivation layer without using an additional mask procedure.

Figure 6:
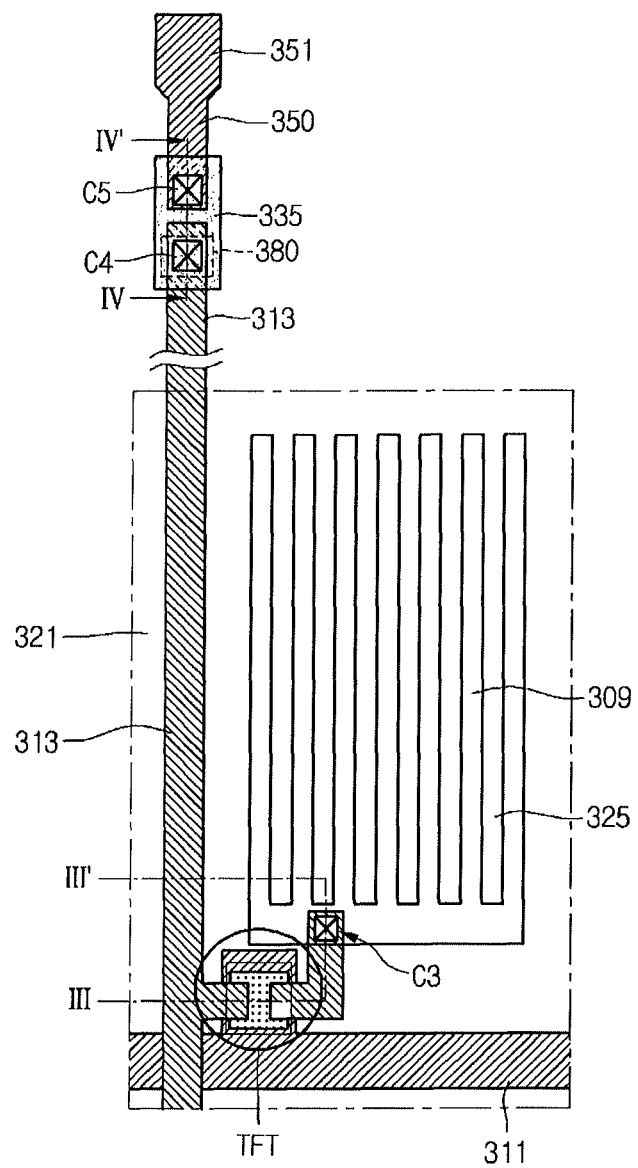
FIG. 6 is a planar view showing a pixel region and a pad contact region of a flat panel display device according to a second embodiment of the present disclosure.

FIG. 6 is a planar view showing a pixel region and a pad contact region of a flat panel display device according to a second embodiment of the present disclosure.

As shown in FIG. 6, the flat panel display device according to a second embodiment of the present disclosure gate and data lines 311 and 313 arranged to cross each other. A pixel region is defined by the gate and data lines 311 and 313 crossing each other. A pixel electrode 309 and a common electrode 325 overlapping each other are arranged within the pixel region.

Also, a thin film transistor TFT is disposed at an intersection of the gate and data lines 311 and 313.

The data line 313 extends to the pad region. One end of the data line 313 is connected to a link line 350, which is formed in a single body united with a pad 351, by means of a connection electrode 335 passing through third and fourth contact holes C3 and C4.

In this embodiment, an auxiliary etch stopper 380 is formed under the data line 313 opposite to the fourth contact hole C4. The auxiliary etch stopper 380 prevents the generation of a pin hole fault in a fourth contact hole region within one end of the data line 313 due to an etch depth difference at the formation of the third and fourth contact holes C3 and C4.

Although it is not clearly shown in the drawing, the second embodiment forces common electrodes 325 to be formed under the slit-shaped pixel electrodes 309, unlike the first embodiment. A common line 321, which is united with the common electrodes 325 in a single body, is formed on the data line 313 with having a second passivation layer (shown in FIG. 7F). In other words, the common line 321 united with the common electrodes 325 in a single body is disposed under the pixel electrode 309 in such a manner as to cover the gate and data lines 311 and 313.

FIGS. 7A through 7G are cross-sectional views illustrating a method of fabricating a flat panel display device and being taken along lines and IV-IV' in FIG. 6.

Referring to FIGS. 7A through 7E, a gate electrode 301 is formed in a pixel region of a substrate 300 by forming a gate metal film on the entire surface of a substrate 300, which is defined the pixel region and a pad contact region, and performing a first mask procedure for the gate metal film. At the same time, a link line 350 connected to a data driver, a pad united with the link line 350 in a single body, and a gate line can be formed in the pad contact region.

The gate metal film can be formed from an opaque conductive material with a low resistance. As an example of the opaque conductive material with the low resistance, one material selected from a group which includes aluminum Al, an aluminum alloy, tungsten W, copper Cu, nickel Ni, chromium Cr, molybdenum Mo, titanium Ti, platinum Pt, tantalum Ta and so on, can be employed. Alternatively, the gate metal film can be formed in a multi layer structure in which at least one transparent conductive material film and at least one opaque conductive material film are stacked. In this case, as an example of the transparent conductive material, indium-tin-oxide ITO, indium-zinc-oxide IZO or others can be employed.

When the above-mentioned gate electrode 301 is formed on the substrate 300, a gate insulation film 302 is formed. The gate insulation film 302 can be formed in a single layer of silicon oxide $SiO_x$. Alternatively, the gate insulation film 302 can be formed by continuously depositing silicon nitride $SiN_x$ and silicon oxide $SiO_x$.

Figure 7A:
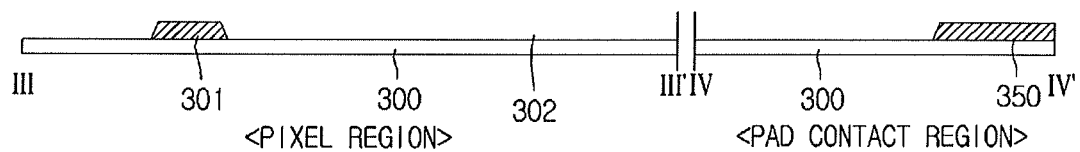
FIGS. 7A through 7G are cross-sectional views illustrating a method of fabricating a flat panel display device and being taken along lines III-III' and IV-IV' in FIG. 6.
Figure 7B:
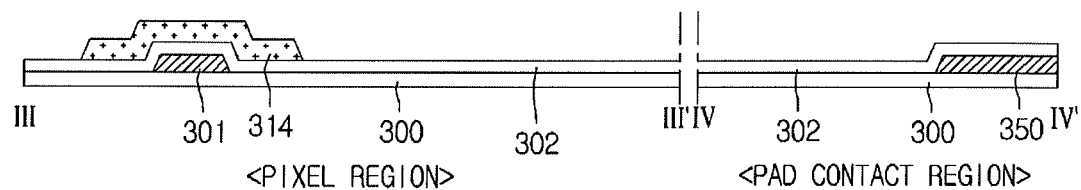

When the above-mentioned gate electrode 301 is formed on the substrate 300, a gate insulation film 302 is formed. A channel layer 314 is formed on the gate insulation film 302 opposite to the gate electrode 301, as shown in FIG. 7B. The channel layer 314 can be provided by forming an oxide layer on the substrate 300 with the gate insulation film 302 and performing a second mask procedure for the oxide layer.

The oxide layer can be formed from an amorphous oxide which includes at least one of indium In, zinc Zn, gallium Ga, hafnium Hf and so on. For example, when an oxide semiconductor of Ga—In—Zn—O is formed through a sputtering process, targets each formed from $In_2O_3$, $Ga_2O_3$ and ZnO or a single target formed from Ga—In—Zn oxide can be used. Alternatively, when an oxide semiconductor of Hf—In—Zn—O is formed through a sputtering process, targets each formed from $HfO_2$, $In_2O_3$ and ZnO or a single target formed from Hf—In—Zn oxide can be used.

Figure 7C:
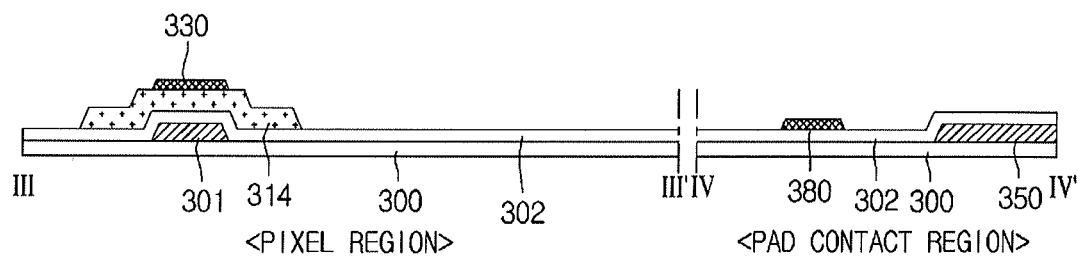

After the channel layer 314 is formed on the substrate 300 as described above, an etch stopper 330 is formed on the channel layer 314, as shown in FIG. 7C. The etch stopper 330 can be provided by forming an insulation layer on the entire surface of the substrate 300 with the channel layer 314 and performing a third mask procedure for the insulation layer. At the same time, an auxiliary etch stopper 380 is also formed in the pad contact region in which a data line will be formed before the formation of a contact hole used for connecting the data line with the link line 350.

Figure 7D:
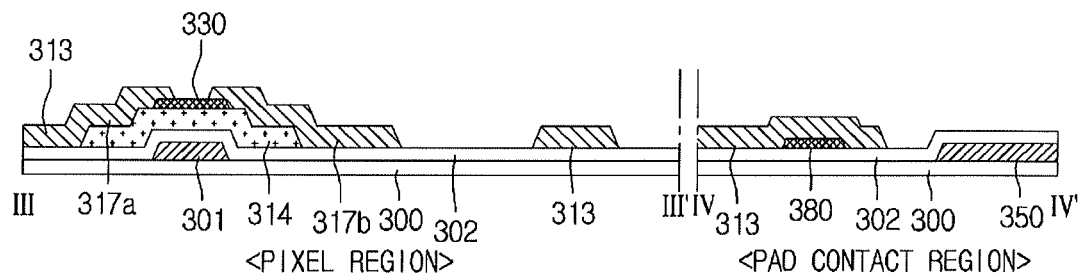

When the above-mentioned etch stopper 330 is formed on the substrate 300, a source electrode 317a and a drain electrode 317b are formed at both ends of the channel layer 314, as shown in FIG. 7D. In accordance therewith, a thin film transistor can be completed. The source and drain electrodes 317a and 317b can be provided by forming a source/drain metal film on the entire surface of the substrate 300 having the etch stopper 330 and performing a fourth mask procedure for the source/drain metal film. In this time, the data line 313 crossing the gate line 311 is also formed within the pixel region. More specifically, the data line 313 electrically connected to the source electrode 317a is formed in such a manner as to extend to an adjacent region to the link line 350 within the pad contact region.

The source/drain metal film can be formed from an opaque conductive material with a low resistance. As an example of the opaque conductive material with the low resistance, one material selected from a group which includes aluminum Al, an aluminum alloy, tungsten W, copper Cu, nickel Ni, chromium Cr, molybdenum Mo, titanium Ti, platinum Pt, tantalum Ta and so on, can be employed. Alternatively, the source/drain metal film can be formed in a multi layer structure in which at least one transparent conductive material film and at least one opaque conductive material film are stacked. In this case, as an example of the transparent conductive material, indium-tin-oxide ITO, indium-zinc-oxide IZO or others can be employed.

Figure 7E:
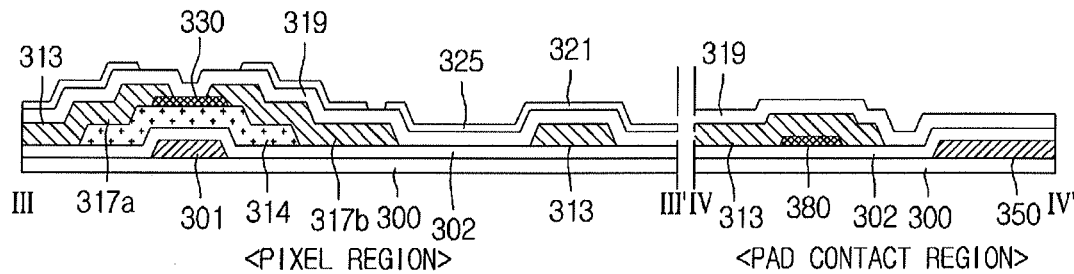

After the source and drain electrodes 317a and 317b are formed on the substrate 300, a first passivation layer 319 is formed on the entire surface of the above mentioned substrate 300, as shown in FIG. 7E. Subsequently, a common electrode 325 is formed on the first passivation layer 319 within the pixel region. The common electrode 325 can be provided by forming a metal film, which includes a transparent conductive material, on the entire surface of the first passivation layer and performing a fifth mask procedure for the metal film. Also, a common line 321 facing the gate and data lines 311 and 313 is formed on the first passivation layer within the pixel region in a single body united with the common electrode 325.

Figure 7F:
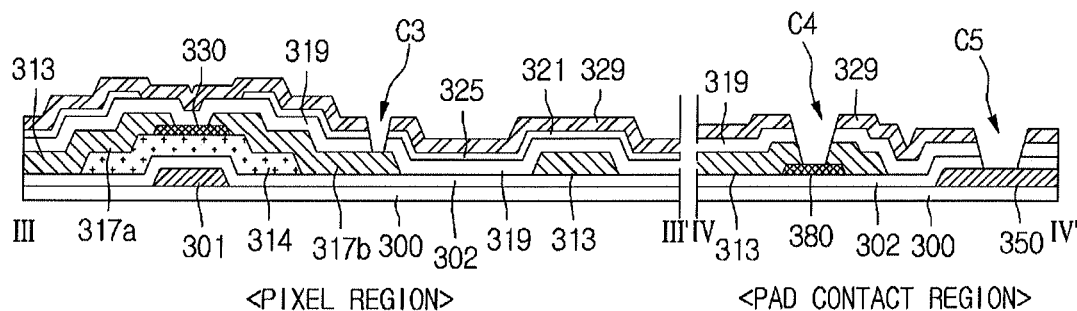
Figure 7G:
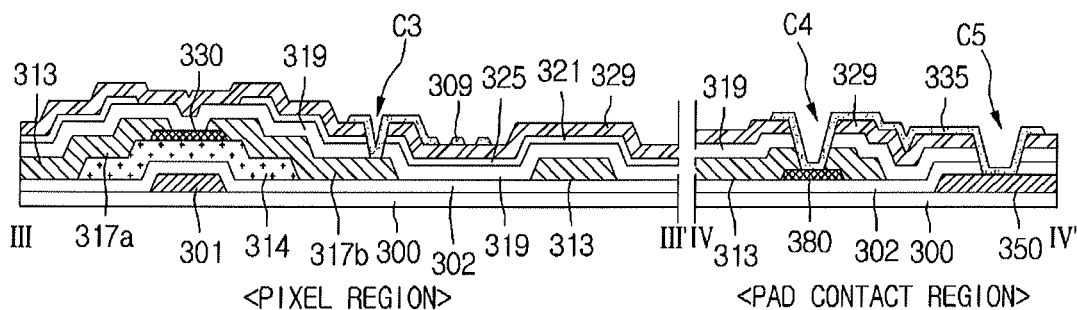

Thereafter, a second passivation layer 329 is formed on the entire surface of the-above mentioned substrate 300, as shown in FIG. 7F. Subsequently, a contact hole formation process is performed in order to forming third through fifth contact holes C3 through C5. The third contact hole C3 is formed in region corresponding to the drain electrode 317b. The fourth contact hole C4 is formed over the auxiliary etch stopper 380 covered with the data line 360. The fifth contact hole C5 is formed over the data link 350. The fourth and fifth contact holes C4 and C5 are used to connect the data line 360 with the link line 350.

The etch depths of the fourth and fifth contact holes C4 and C5 are different from each other. This results from the fact that the gate insulation film 302 and the first and second passivation layers 319 and 329 are stacked on the link line 350 but the first and second passivation layers 319 and 329 is only formed on the data line 360.

As such, the data line 360 must be physically etched during the formation of the fifth contact hole C5. However, the auxiliary etch stopper 380 formed under the data line 360 prevents an over etch which allows the gate insulation film 202 to be etched.

Consequently, the second embodiment of the present disclosure can prevent the generation of a pin hole fault in the pad contact region without employing an additional mask procedure.

When the above-mentioned third through fifth contact holes C3 through C5 are formed, slit-shaped pixel electrodes 309 are formed over the common electrode 325 within the pixel region, as shown in FIG. 5G. The pixel electrodes 309 can be provided by forming a transparent conductive material film on the entire surface of the above-mentioned substrate 300 and performing a sixth mask procedure for the transparent conductive material film.

Moreover, a connection electrode 335 used to electrically connect the data line 360 with the link line 350 is formed within the pad contact region when the pixel electrodes 309 are formed. In other words, the data line 360 and the link line 350 are electrically connected to each other by the connection electrode 235 with both ends which pass through the fourth and fifth contact holes C4 and C5, respectively.

The second embodiment of the present disclosure allows the auxiliary etch stopper to be formed under the data line within the pad contact region when the etch stopper is formed within the thin film transistor area. In accordance therewith, the generation of a pin hole fault in the data line area at the contact hole formation can be prevented.

Also, the second embodiment of the present disclosure can prevent the generation of a pin hole fault in the pad contact region of the passivation layer without employing an additional mask procedure.

Figure 8:
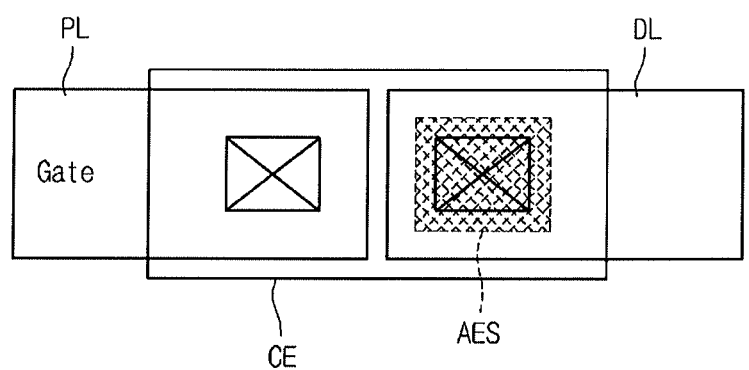
FIG. 8 is a planar view showing a pad contact region of the flat panel display device according to the first and second embodiments of the present disclosure.

FIG. 8 is a planar view showing a pad contact region of the flat panel display device according to the first and second embodiments of the present disclosure. As shown in FIG. 8, in the outside of the pixel region, the pad link line PL formed on the substrate and the data line DL formed on the gate insulation film are disposed.

The pad link line PL and the data line DL are connected to each other by means of the connection electrode CE. The connection electrode CE is connected to the pad link line PL and the data line DL via the contact holes, which are formed over the pad link line PL and the data line DL. The auxiliary etch stopper AES for preventing a pin hole fault, which can be caused by over-etch, is formed under the data line DL in such a manner as to overlap with the contact hole of the data line DL In this manner, the embodiments of the present disclosure can prevent the generation of a pin hole fault and a connection defect, which can be caused by the contact hole, without using an additional mask procedure.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

The invention claimed is:

1. A method of fabricating a flat panel display device with an oxide thin film transistor, the method comprising:
   preparing a substrate defined into a pixel region and a pad contact region;
   forming a gate electrode and a link line in the pixel region and the pad contact region of the substrate;
   sequentially forming a gate insulation film and a first transparent conductive material film on the substrate provided with the gate electrode and performing a first mask procedure for the first transparent conductive material film to form a pixel electrode within the pixel region;

forming an oxide layer on the substrate provided with the pixel electrode and performing a second mask procedure for the oxide layer to form a channel layer on the gate insulation film opposite to the gate electrode;

forming an insulation layer on the substrate provided with the channel layer and performing a third mask procedure for the insulation layer to form an etch stopper, which is disposed on a central region of an upper surface of the channel layer, and an auxiliary etch stopper disposed on the gate insulation film of the pad contact region which will be occupied by a data line;

forming a metal film on the entire surface of the substrate after the etch stopper is formed on the substrate and performing a fourth mask procedure for the metal film to form source and drain electrodes and the data line, which has one end overlapping with the auxiliary etch stopper within the pad contact region, wherein the source and drain electrodes are contacted with the etch stopper, the channel layer and the gate insulation film;

forming a passivation layer on the substrate provided with the source and drain electrodes and performing a formation process of contact holes to expose the link line and the data line opposite to the auxiliary etch stopper; and forming a second transparent conductive material film on the substrate with the contact holes and performing a fifth mask procedure to form a common electrode, which is disposed within the pixel region, and a connection electrode which is disposed within the pad contact region and connects the data line with the link line.

2. The method of claim 1, wherein the gate electrode is formed of an opaque conductive material.

3. The method of claim 2 wherein the opaque conductive material is selected from the group consisting of aluminum Al, an aluminum alloy, tungsten W, copper Cu, nickel Ni, chromium Cr, molybdenum Mo, titanium Ti, platinum Pt and tantalum Ta.

4. The method of claim 1, wherein the pixel electrode is formed from one of indium tin oxide ITO and indium zinc oxide IZO.

5. The method of claim 1, wherein the pixel electrode comes in direct contact with the drain electrode.

6. The method of claim 1, wherein the auxiliary etch stopper prevents an over etch of the gate insulation film which is disposed under the data line when the contact holes are formed in the passivation layer.

7. The method of claim 1, wherein the oxide layer is formed of IGZO (indium gallium zinc oxide).

8. A method of fabricating a flat panel display device with an oxide thin film transistor, the method comprising:

preparing a substrate defined into a pixel region and a pad contact region;

forming a gate electrode and a link line in the pixel region and the pad contact region of the substrate;

sequentially forming a gate insulation film and an oxide layer on the substrate provided with the gate electrode and performing a first mask procedure for the oxide layer to form a channel layer on the gate insulation film opposite to the gate electrode;

forming an insulation layer on the substrate provided with the channel layer and performing a second mask procedure for the insulation layer to form an etch stopper, which is disposed on a central region of an upper surface of the channel layer, and an auxiliary etch stopper disposed on the gate insulation film of the pad contact region which will be occupied by a data line;

forming a metal film on the entire surface of the substrate after the etch stopper is formed on the substrate and performing a third mask procedure for the metal film to form source and drain electrodes and the data line, which has one end overlapping with the auxiliary etch stopper within the pad contact region;

sequentially forming a first passivation layer and a first transparent conductive material film on the substrate provided with the source and drain electrodes and performing a fourth mask procedure for the first transparent conductive material film to form a common electrode on the first passivation layer within the pixel region, wherein the source and drain electrodes are contacted with the etch stopper, the channel layer and the gate insulation film;

forming a second passivation layer on the substrate provided with the common electrode and performing a formation process of contact holes to form contact holes over the drain electrode, the link line and the data line opposite to the auxiliary etch stopper; and forming a second transparent conductive material film on the substrate with the contact holes and performing a fifth mask procedure to form a pixel electrode, which is disposed on the second passivation layer opposite to the common electrode within the pixel region, and a connection electrode which is disposed within the pad contact region and connects the data line with the link line.

9. The method of claim 8, wherein the gate electrode is formed from one of an opaque conductive material.

10. The method of claim 9, wherein the opaque conductive material sis selected from the group consisting of aluminum Al, an aluminum alloy, tungsten W, copper Cu, nickel Ni, chromium Cr, molybdenum Mo, titanium Ti, platinum Pt and tantalum Ta.

11. The method of claim 8, wherein the pixel electrode is formed from one of indium tin oxide ITO and indium zinc oxide IZO.

12. The method of claim 8, wherein the pixel electrode comes in contact with the drain electrode through the contact hole which is formed in the first and second passivation layers.

13. The method of claim 8, wherein the auxiliary etch stopper prevents an over etch of the gate insulation film which is disposed under the data line when the contact holes are formed in the passivation layer.

14. The method of claim 8, wherein the oxide layer is formed of IGZO (indium gallium zinc oxide).

* * * * *